United States Patent
Ujihara et al.

(10) Patent No.: US 7,800,278 B2
(45) Date of Patent: Sep. 21, 2010

(54) ENERGY HARVESTING BY MEANS OF THERMO-MECHANICAL DEVICE UTILIZING BISTABLE FERROMAGNETS

(75) Inventors: Motoki Ujihara, Tokyo (JP); Dong Gun Lee, Los Angeles, CA (US); Gregory P. Carman, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 128 days.

(21) Appl. No.: 12/162,082

(22) PCT Filed: Jan. 24, 2007

(86) PCT No.: PCT/US2007/002005

§ 371 (c)(1),
(2), (4) Date: Jul. 24, 2008

(87) PCT Pub. No.: WO2007/087383

PCT Pub. Date: Aug. 2, 2007

(65) Prior Publication Data

US 2009/0315335 A1    Dec. 24, 2009

Related U.S. Application Data

(60) Provisional application No. 60/761,789, filed on Jan. 25, 2006.

(51) Int. Cl.
*H02N 10/00* (2006.01)
*H02N 1/00* (2006.01)
(52) U.S. Cl. ...................... 310/306; 310/339
(58) Field of Classification Search .................. 310/306, 310/307, 339; 290/1 R; 60/527, 528
See application file for complete search history.

(56) References Cited

U.S. PATENT DOCUMENTS

| 2,391,313 | A | * | 12/1945 | Hindle | ........................ 310/306 |
| 3,456,134 | A | | 7/1969 | Ko et al. | |
| 4,900,970 | A | | 2/1990 | Ando et al. | |
| 6,433,465 | B1 | | 8/2002 | McKnight et al. | |
| 6,858,970 | B2 | | 2/2005 | Malkin et al. | |
| 6,975,060 | B2 | * | 12/2005 | Styblo et al. | ................. 310/306 |
| 6,984,902 | B1 | | 1/2006 | Huang et al. | |

(Continued)

FOREIGN PATENT DOCUMENTS

EP       1384884       *    1/2004

(Continued)

OTHER PUBLICATIONS

International Search Report issued in International Application No. PCT/US2007/002005, mailed on Nov. 20, 2007.

(Continued)

*Primary Examiner*—Karl I Tamai
(74) *Attorney, Agent, or Firm*—Venable LLP; Henry J. Daley

(57) ABSTRACT

An inventive energy harvesting apparatus may include a ferromagnetic material and/or a shape memory alloys to convert thermal energy to mechanical energy to electrical energy. The apparatus is subjected to a thermal gradient to cause beams to bend thus creating stress/strain in a piezoelectric material, or creating magnetic flux in a magnetic path. The charges created in this process can be transferred to electrical batteries.

12 Claims, 3 Drawing Sheets

U.S. PATENT DOCUMENTS

| | | | |
|---|---|---|---|
| 6,995,496 | B1 | 2/2006 | Hagood, IV et al. |
| 7,081,693 | B2 * | 7/2006 | Hamel et al. ............... 307/151 |
| 7,397,169 | B2 * | 7/2008 | Nersessian et al. .......... 310/339 |
| 2005/0205125 | A1 | 9/2005 | Nersessian et al. |
| 2005/0242591 | A1 | 11/2005 | Roskey |
| 2008/0136292 | A1 * | 6/2008 | Thiesen ..................... 310/334 |
| 2009/0315335 | A1 * | 12/2009 | Ujihara et al. ............. 290/1 R |

FOREIGN PATENT DOCUMENTS

| | | |
|---|---|---|
| JP | 2006-158113 A | 6/2006 |
| WO | WO 00/64038 A1 | 10/2000 |

OTHER PUBLICATIONS

Written Opinion issued in International Application No. PCT/US2007/002005, mailed on Nov. 20, 2007.

International Search Report issued in International Application No. PCT/US2007/026123, mailed on Jul. 1, 2008.

Written Opinion issued in International Application No. PCT/US2007/026123, mailed on Jul. 1, 2008.

H. A. Sodano, D. J. Inman, G. Park, *The Shook and Vibration Digest*, vol. 36: 197-205 (2004).

H.W. Kim, A. Batra, S. Priya, K. Uchino, D. Markley, R. E. Newnham, H. F. Hofmann, *The Japan Society of Applied Physics*, vol. 43 9A:6178-6183 (2004).

J.A. Paradiso, T. Starner, *IEEE Pervasive Computing*, Jan.-Mar.: 18-27 (2005).

J.M. Gordon, Am. J. Phys., vol. 59, No. 6: 551-555 (1991)].

N.S.Shenck, J.A. Paradisco, *IEEE Micr*. vol. 21:30-41 (2001).

P. Krulevitch, A.P. Lee, P.B. Ramsey, J.C. Trevino, J. Hamilton, M.A. Northrup, *J. Microelectromech. Syst.*, vol. 4, No. 5: 270-282 (1996).

S. Roundy, E.S. Leland, J. Baker, E. Carleton, E. Reilly, E. Lai, B. Otis, J. M. Rabacy, P. K. Wright, *IEEE Pervasive Computing*, Jan.-Mar.:26-35 (2005).

S. Roundy, P.K. Wright, J. Rabacey, *Computer Communications*, col. 26:1131-1144 (2003); found 240475 Spec.

S.B. Horowitz, M. Sheplak, L.N. Cattafests Ill, T. Nishida, *J Micromech Microeng*, vol. 16: S174-S181 (2006).

S.P. Beedy, M.J. Tudor, E. Koukhanenko, N.M. White, T.O'Donnell, C. Saha, S. Kulkarni, S. Roy, *Transducers*,05, 780-783 (2005); found 240475 Spec.

Y.B. Jeon, R. Sood, J.H. Jeog, S.G. Kim, Sensors and Actuators, *A:Physical*, vol. 122:16-22 (2005); found 240475 Spec.

Yonghui, X. Jingying, Chem. J. on Internet, vol. 7, No. 2: 19 (2005).

* cited by examiner

ENERGY HARVESTING BY MEANS OF THERMO-MECHANICAL DEVICE UTILIZING BISTABLE FERROMAGNETS

CROSS-REFERENCE OF RELATED APPLICATION

This application claims priority to U.S. Provisional Application No. 60/761,789 filed Jan. 25, 2006, and PCT/US2007/002005 filed Jan. 24, 2007 the entire contents of which are hereby incorporated by reference.

This invention was made with Government support of Grant No. FA9550-04-1-0067 awarded by the Air Force Office of Scientific Research. The government has certain rights in this invention.

BACKGROUND

1. Field of Invention

Embodiments of the present invention relate to thermal energy harvesting (or thermal energy scavenging) techniques using ferromagnetic materials which provide a mechanical motion and piezoelectric, electroactive, electromagnetic, and/or magnetostrictive generator which converts the mechanical energy into electrical energy. In addition, shape memory alloys can be added to obtain enhanced operational effects.

2. Discussion of Related Art

The contents of all references, including articles, published patent applications and patents referred to herein are hereby incorporated by reference.

Thermal energy harvesting (or thermal energy scavenging) is defined as the conversion of heat energy, for example, but not limited to, using thermal gradation into usable electrical energy. Thermal gradations can be found where waste heat is involved such as oil pipe lines, engines, and electrical devices. The electrical energy harvested can then be used as a power source for a variety of low-power applications, such as, but not limited to, remote applications that may involve networked systems of wireless sensors and/or communication nodes, where other power sources such as batteries may be impractical [J. A. Paradiso, T. Starner, *IEEE Pervasive Computing*, Jan.-Mar.:18-27 (2005); S. Roundy, E. S. Leland, J. Baker, E. Carleton, E. Reilly, E. Lai, B. Otis, J. M. Rabacy, P. K. Wright, *IEEE Pervasive Computing*, Jan.-Mar.:28-35 (2005) ]. For these reasons, the amount of research devoted to power harvesting has been rapidly increasing [H. A. Sodano, D. J. Inman, G. Park, *The Shook and Vibration Digest*, Vol. 36: 197-205 (2004)].

Thermal energy has been successfully converted into electrical energy by using thermoelectric materials. These materials use the inverse Peltier effect, with which a voltage is generated when a temperature difference exists across a gap. The efficiency of thermoelectric devices is determined by the figure of merit (ZT) of the material, given by $$ZT = \frac{\alpha^2}{\rho k} T,$$

where α, ρ, k, and T are the Seebeck coefficient, electrical resistivity, thermal conductivity, and average operating temperature in absolute scale. The efficiency of the device is expressed as $$\eta = \frac{\Delta T}{T_h} \frac{\sqrt{1+z\overline{T}} - 1}{\sqrt{1+z\overline{T}} + T_c/T_h},$$

where the first term, $$\frac{\Delta T}{T_h}$$

denotes Carnot efficiency and the second term, $$\frac{\sqrt{1+z\overline{T}} - 1}{\sqrt{1+z\overline{T}} + T_c/T_h}$$

denotes the limiting efficiency by thermoelectric materials. While useful, these materials produce little energy and efficiency for small temperature differences. [J. M. Gordon, *Am. J. Phys.*, vol. 59, no. 6: 551-555 (1991)]. For example, even using the recently developed super lattice AgPb$_m$SbTe$_{2+m}$ (ZT=2), the limiting efficiency becomes 18.3% for ΔT=100° C. and Tc=0° C., which is thought to be an optimistic view, given that commercially available chips (ZT<1) have no more than 11.4% efficiency [G. Yonghui, X. Jingying, *Chem. J. on Internet*, vol. 7, no. 2: 19 (2005)].

Recently, it has been proposed that thermal energy could be converted into electrical energy with high efficiency by coupling thermo-mechanical and electrical devices. [See U.S. provisional patent application No. 60/554,747 and published U.S. Application Number 2005/0205125, the entire contents of which are incorporated herein by reference It is claimed that improved conversion performance can be obtained by using a piezoelectric material and a thermostrictive material which exhibits a large thermally induced strain due to a phase transformation. One description of this relies on bending through a bimorph effect by placing it between a hot heat source and a cold heat sink.

Mechanical energy can be converted using a piezoelectric material, electroactive polymers, and electromagnetic induction. The amount of power accumulated via the piezoelectric harvester is proportional to the mechanical frequency which is exciting it [H. W. Kim, A. Batra, S. Priya, K. Uchino, D. Markley, R. E. Newnham, H. F. Hofmann, *The Japan Society of Applied Physics*, Vol. 43 9A:6178-6183 (2004)]. In addition, the voltage created in a piezoelectric material is proportional to the stress/strain. Therefore, increasing the operating frequency and applying higher stresses/strains are key to generating higher power. In addition to piezoelectric materials, there are other materials which convert mechanical energy into electrical energy such as electroactive polymer, electromagnetic induction, and magnetostrictive materials. Electroactive polymers such as PVDF convert mechanical energy into electrical energy using principles similar to piezoelectric materials. In electromagnetic induction, voltage is generated when there is a change in magnetic flux through any surface bounded by the path based on Faraday's law. Magnetostrictive materials change their magnetization depending on mechanical load. When combined with an electromagnetic coil mechanical energy can be converted into electrical energy. Therefore, there are many types of transmission of mechanical energy into electrical energy.

A shape-memory material is one that undergoes a change of crystal structure at a certain temperature, called the transformation temperature. Above this temperature the material has one crystal structure, called the Austenite phase, and below a relatively lower temperature it has another phase, called the Martensite phase. Each phase has different material properties such as Young's modulus and Yield strength. The low temperature structure of these types of materials allows the material to be easily deformed. Since a shape memory alloy has high energy density [P. Krulevitch, A. P. Lee, P. B. Ramsey, J. C. Trevino, J. Hamilton, M. A. Northrup, *J. Microelectromech. Syst.*, vol. 4, no. 5: 270-282 (1996)], it can be added to an energy harvesting system to substantially enhance both the strain/stress and frequency developed in piezoelectric materials during thermal cycling. Ferromagnetic materials have a long term order of the magnetic moments resulting in formation of domains. Examples include transition metals iron, cobalt, nickel, and some of the rare earth metals such as gadolinium. Permanent magnetic moments in ferromagnetic materials result from atomic magnetic moments due to electron spin. An increase in temperature causes more atomic vibrations, which tend to randomize the magnetic moments. The saturation magnetization decreases gradually with increasing temperature, and drops to zero sharply at a temperature called the "Curie temperature." Above the Curie temperature, Tc, ferromagnetic and ferrimagnetic materials become paramagnetic, at which only a negligible amount of magnetic moments exist.

BRIEF SUMMARY

An objective of the present invention is to provide an approach for increased available energy, and for increased operational frequency. The former can be achieved by improved designs of piezoelectric/electroactive elements, and solenoids. In addition, better efficiency and power output can be achieved by using exotic ferromagnetic materials which have high saturation magnetization values and high thermal conduction properties.

For the device to produce energy in a static thermal field, a bi-stable mechanism can be used to avoid a structure that physically stalls. To achieve this bi-stability, ferromagnets can be added to the system. An added benefit according to some embodiments of the current invention is an enhancement of the operating frequency by having better contact between heat sources and the energy harvesting devices. In order to increase the power density produced, increasing strain on piezoelectric/electroactive material, and/or increasing the operating frequency are considered. To increase the strain or operating frequency, shape memory alloys such as NiTi, NiTiCu, NiTiPt, AuCd, InTi, NiMnGa and FePt can be added to the system. Increasing the frequency also relies on designing the heat conducting paths, that is, it is desirable to employ a design to minimize/eliminate material in the heat path according to some embodiments of the current invention.

A particular embodiment of the invention is described below. An energy harvesting apparatus may comprise: a bimorph cantilever that is deflectable due to thermal expansion effects; a shape memory alloy which undergoes a phase change to have different Young's modulus and shape; piezoelectric materials capable of producing charge or voltage resulting from the predetermined induced strain produced by the bimorph deflection; a ferromagnetic material which loses its ferromagnetic properties when it reaches a specific temperature, Tc; a magnetic hot heat source; a cold heat sink with a heat conducting plate. The cantilever design is composed of a piezoelectric material and/or shape memory material, and a ferromagnetic material. Another apparatus may comprise: a flap with tethers which can move vertically due to spring forces in the tethers; piezoelectric/electroactive materials; ferromagnetic materials. Instead of piezoelectric/electroactive materials, an electromagnetic induction mechanism can also be employed. The piezoelectric materials include lead-based ceramics such as PZT, PLZT, PMNT, PMNZ, and PFW. Piezoelectric materials can be directly substituted by electroactive polymers such as PVDF, electromagnetic induction systems, or magnetostrictive materials with coils. Shape memory materials include NiTi, NiTiX where X denotes other elements such as Pt, Pd and Cu, and NiMnGa. Ferromagnetic materials include but are not limited to Fe, Ni, Co, Dy, Gd, Tb, Ho, Er, and alloys such as MnB, NiMnGa, EuO, DyFe. A system according to embodiments of the invention may comprise the above-described apparatus, as well as an electrical device coupled to receive the electrical signal. Embodiments of the invention may also include methods of implementing the above-described apparatus.

BRIEF DESCRIPTION OF THE DRAWINGS

Additional features of this invention are provided in the following detailed description of various embodiments of the invention with reference to the drawings. Furthermore, the above-discussed and other attendant advantages of the present invention will become better understood by reference to the detailed description when taken in conjunction with the accompanying drawings, in which:

FIG. 2-1 is a perspective view of an apparatus according to another embodiment of the current invention without heat sources. FIGS. 2-2 and 2-3 are side views of the apparatus of FIG. 2-1 to illustrate how it cycles according to temperature.

FIGS. 3-1 and 3-2 are the side views of an energy harvesting device according to another embodiment of the invention that is similar to the embodiment of FIG. 2-1 except it has an induction mechanism in place of piezoelectric energy conversion structures.

DETAILED DESCRIPTION

Energy conversion between thermal and electrical energies may be provided in accordance with embodiments of the present invention to generate a high efficiency transducer as an alternative to thermoelectric devices for small temperature gradient. The following detailed description sets forth examples of embodiments according to the current invention. These are only a few of the many considered possible embodiments of this invention, and as such, the description is regarded as disclosing representative examples. Other embodiments are not necessary for an understanding of the invention and are not illustrated. In other instances, well-known features have not been described in detail. Other such modifications and alternatives are considered to be within the scope of the current invention. The figures illustrating various embodiments of the present invention are not drawn to scale.

Figure 1:
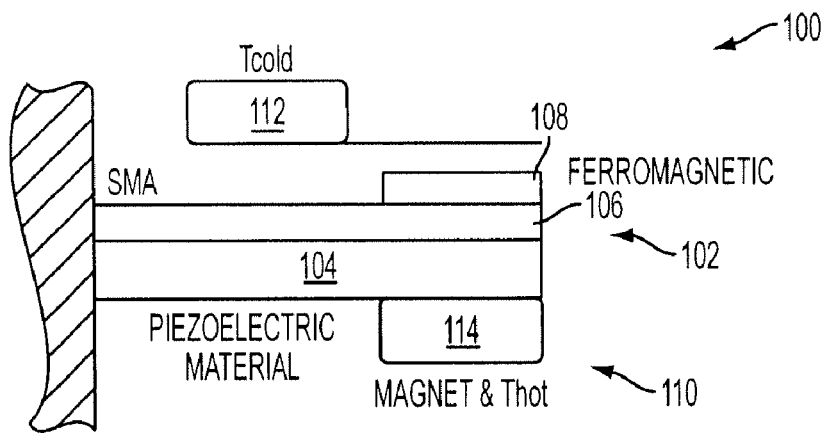
FIGS. 1-1, 1-2, and 1-3 illustrate schematically how the apparatus according to an embodiment of the current invention cycles according to its temperature.

FIG. 1-1 is a schematic illustration of an energy harvesting device 100 according to an embodiment of the present invention. In FIG. 1-1, a bimorph cantilever beam 102 can be composed of a piezoelectric layer 104, a shape-memory-alloy layer 106, and a ferromagnetic layer 108 placed between a heat source 110 and a heat sink 112. The shape memory alloy (SMA) 106 has transformation temperatures, namely the Austenite phase transformation temperature which occurs at higher temperature, $T_A$, and the Martensite phase transformation temperature, $T_M$, which occurs at lower temperature. SMA 106 has high Young's modulus at $T>T_A$, and low Young's modulus at $T<T_M$. Young's modulus is represented as a mixture of the two phases when the temperature is between $T_A>T>T_M$ depending up on the specific temperature. The ferromagnetic material 108 has a temperature, Tc, where the material ceases to be ferromagnetic, which is around $T_A$. When the beam 102 temperature is below $T_M$, the spring force of the SMA required to warp the beam 102 is low due to low Young's modulus of SMA 106. In addition, when the temperature of the ferromagnetic material 108 is less than Tc, the magnetic force between the ferromagnetic material 108 and magnets 114 is stronger than the spring force of the beam 102. The magnetic force is proportional to the inverse of $\delta^2$, where $\delta$ is the distance between the beam 102 and the hot heat source 110, so the forces increase as the beam bends toward the hot heat source. Thus, at this temperature the beam 102 is fully touching the hot heat source 110.

Figures 1, 2:
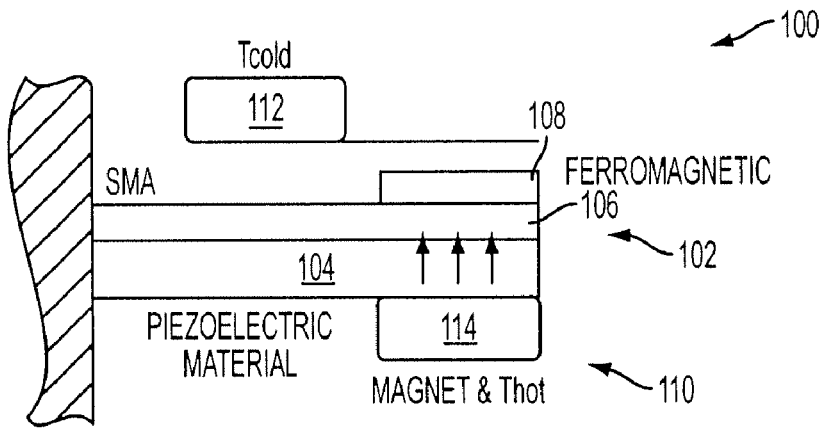
Figures 1, 2, 3:
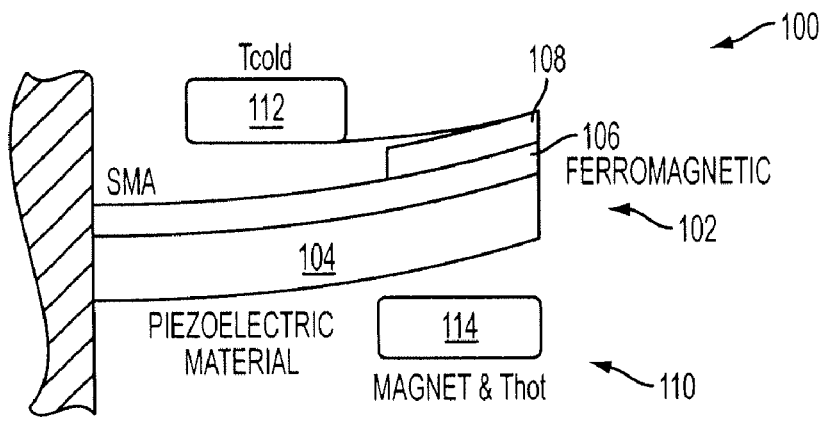
Figures 1, 2:
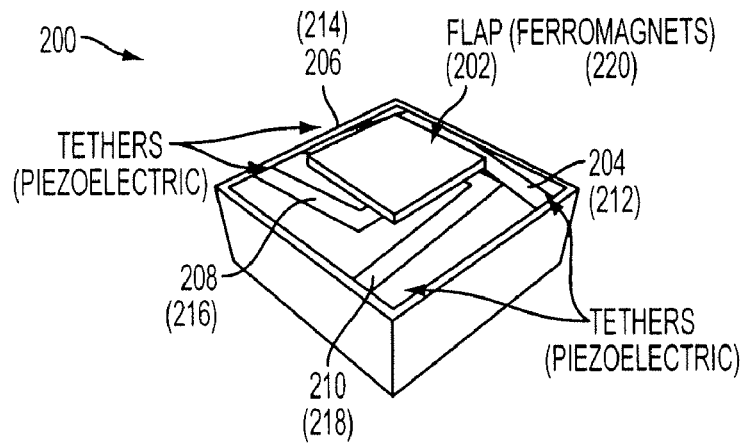
Figure 2:
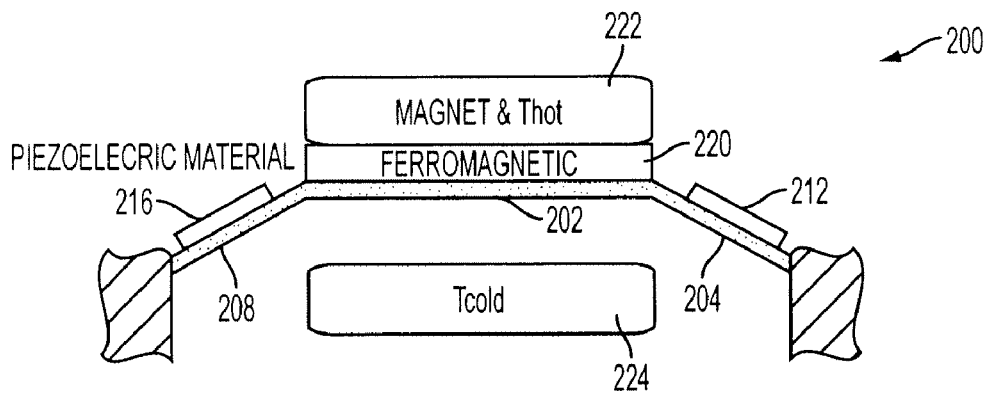
Figures 2, 3:
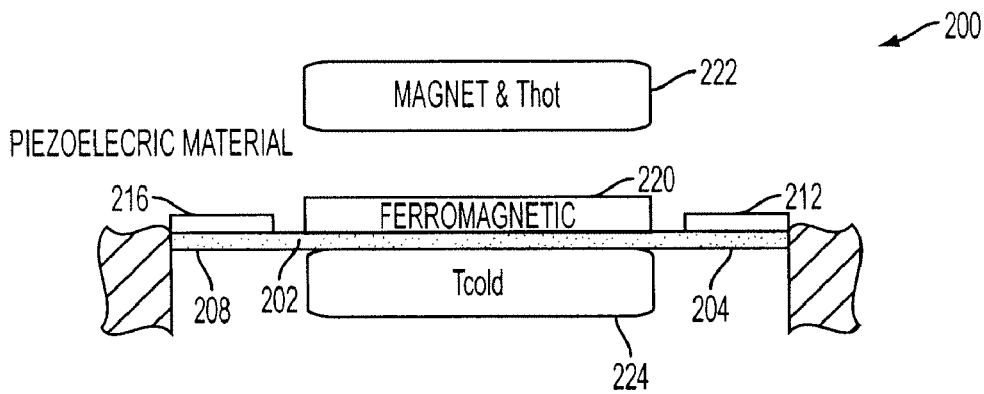
Figures 1, 3:
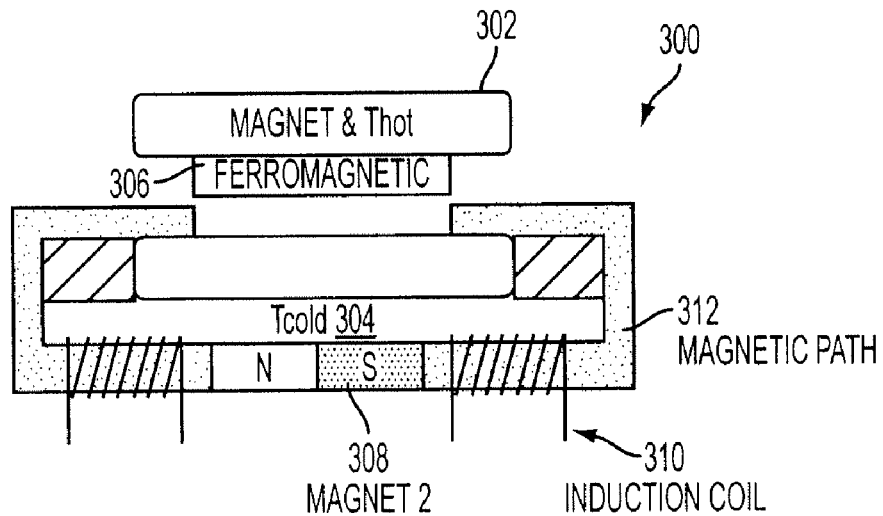
Figures 2, 3:
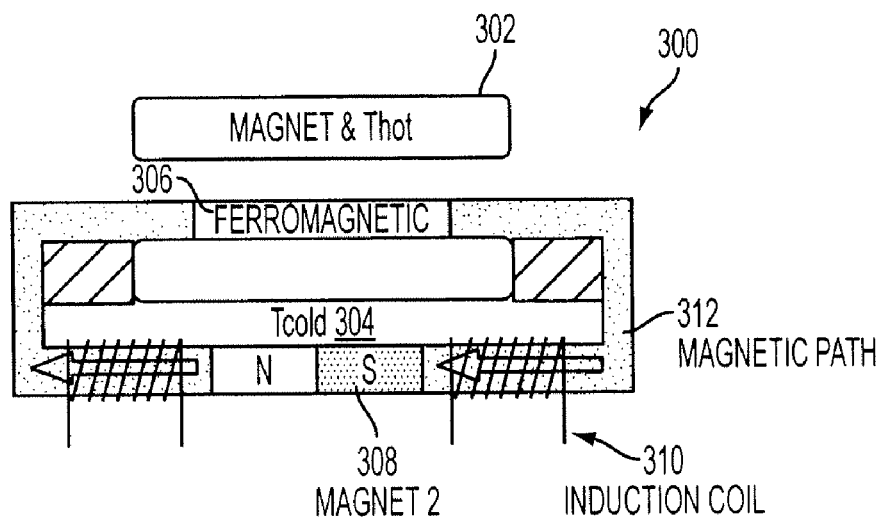

FIG. 1-2 shows that the cantilever beam 102 is still attached to the heat source 110 even after the beam 102 begins to heat up. At this stage, the temperature of the beam 102 stays between $T_M$ and $T_A$ and is still less than Tc. The spring force due to the SMA 106 increases because both Young's modulus of SMA 106 becomes higher and the intrinsic shape memory effect (i.e. the SMA is hot shaped to be in contact with the cold source). At a critical temperature near Tc=$T_A$, the magnetic force is insufficient to restrain the beam on the hot side 110. FIG. 1-3 illustrates that the cantilever beam 102 has moved to touch the cold heat sink 112 due to both stiffness of the beam 102 and intrinsic shape memory effect, on top of paramagnetic behavior of the ferromagnetic material 108 (i.e. the magnetic attraction is eliminated). The movement of the beam from the heat source and the cold heat sink creates stresses/strains in the piezoelectric layer 104. The charge created in this stage can be transferred to electrical storage devices such as batteries and capacitors. In this stage, the temperature of the beam 102 increased beyond Tc and $T_A$, causing the spring force produced by the SMA 106 to increase and the magnetic force to essentially vanish. Since the spring force overcomes the magnetic force, the bimorph will snap toward the stable configuration.

Once the beam 102 touches the cold sink 112, the temperature of the beam 102 starts to decrease. When the temperature becomes lower than $T_A$, the curvature decreases so that $\delta$ becomes smaller. The function of the plate is to have a thermal conduction even when $\delta$ changes. When the cooling continues, the temperature of the beam 102 gets close to $T_M$, thus further decreasing $\delta$, and in the meantime, the temperature of the ferromagnetic material 108 decreases below Tc and the magnetic force will increase and subsequently overcome the spring force and brings the beam toward the hot source and the magnet 114.

FIG. 2-1 shows a second embodiment of an energy harvesting device 200 according to the present invention. In FIG. 2-1, the apparatus 200 is composed of a flap 202 with tethers (204, 206, 208, 210) which restrain the motion in the vertical direction only, a piezoelectric layer (212, 214, 216, 218) which is attached to the tethers where stress/strain is generated, and a ferromagnetic layer 220 on flap 202. This deign can allow faster frequency by eliminating the heat transfer though piezoelectric materials which have low thermal conduction coefficients. In addition, this design does not incorporate SMA and relies on the bending of the tether elements for a restoring force. It is believed that this design surpasses any thermoelectric device in the area of efficiency. The limiting efficiency of the best research-level super-lattice thermoelectric material is less than 20% for $\Delta T<100K$. On the other hand, the limiting efficiency of the current invention can potentially reach more than 25%, which is calculated as $$\left(\frac{\frac{1}{2}M_s^2\mu_o}{C_p\rho\Delta T}\right)(k_{33}^2),$$

where $M_s$, $\mu_o$, $C_p$, $\rho$, T, k are the saturation magnetization, permeability in vacuum, specific heat, density, temperature, and piezoelectric coefficient, respectively. The numerator equates to magnetic potential energy, the denominator equates to thermal energy to induce the magnetic energy difference, and the second term equates to the mechanical to electrical conversion ratio. Assuming, the supporting layer for ferromagnets has a negligible thickness, the heat needs to be transferred to ferromagnets. When using Dy for ferromagnetic material and PMZT for piezoelectric material ($M_s$=2800 emu/cm$^3$, Cp=170 J/kg-K, $\rho$=8540 kg/M$^3$, and $\Delta T$=10K, $k_{33}$=90%), the limiting efficiency reaches 27.5%. It is important to note that higher efficiency can be obtained with ferromagnetic materials which have higher saturation magnetization values.

In FIG. 2-2, a hot heat source 222 made with magnetic material is placed above the ferromagnet layer, and a cold heat sink 224 is placed under the flap 202. In this stage, the temperature of the beam is less than Tc, and it is being heated.

In FIG. 2-3, when the temperature becomes higher than Tc, the magnetic force is overcome by the spring force in the tether elements. The flap 202 will then snap to the cold heat sink 224. In this stage, stress/strain is created in the tethers (204, 206, 208, 210), creating voltage which is then transferred to electrical storage devices. When the beam is cooled sufficiently, the magnetic force will overcome the spring force, thus snapping back to the previous stage.

FIG. 3-1 shows a third embodiment of an energy harvesting device 300 according to the present invention. In FIG. 3-1, the apparatus 300 is composed of a heat source with a hard magnet 302, a cooling side 304, a ferromagnetic material 306 which has restrained motion in the vertical direction only, a secondary hard magnet 308, and an electromagnetic induction coil 310 which is wrapped around the magnetic path 312. This design can allow faster frequency by eliminating the heat transfer through extra materials. It is also possible to reduce the device cost. In this stage, the temperature of the ferromagnetic material 306 is less than TC, so the ferromagnetic material is attracted to the heat source 302. The magnetic path can be considered as open in this situation.

In FIG. 3-2, the ferromagnetic material is on the cooling side 304 by a spring mechanism or gravity. In this stage, the temperature of the ferromagnetic material is more than Tc, and it is being cooled. When the magnetic path closes, there is a magnetic flux change inside the coils 310, which creates voltage/current to the system.

The above-described embodiments of the current invention may be deployed in many scenarios. Typical scenarios may be those in which a low-power electrical system is to be powered in an environment where there is a thermal gradient. For example, remote sensing and/or communication devices may be deployed in such environments (e.g., mounted on machinery or other platforms that normally vibrate, are subjected to vibration, and/or otherwise move), and embodiments of the inventive system may be used to provide power to such devices without the use of batteries or wired power sources.

The invention has been described in detail with respect to various embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

We claim:

1. An energy harvesting device, comprising:
a ferromagnetic component suitable to be arranged between a heat source and a heat sink;
a mechanical assembly structured to support said ferromagnetic component in a first configuration such that said ferromagnetic component is in thermal contact with said heat source and in a second configuration such that said ferromagnetic component is in thermal contact with said heat sink, said mechanical assembly structured to have a transient state of motion due to said ferromagnetic component satisfying first and second conditions, namely a first condition when a temperature of a ferromagnetic material of said ferromagnetic component T is less than Tc, and a second condition when the temperature of the ferromagnetic material of said ferromagnetic component T is more than Tc,
wherein said mechanical assembly comprises an electromechanical transducer constructed and arranged to produce electrical power while said mechanical assembly is in said transient state of motion between said first and second configurations, and
wherein said mechanical assembly comprises a shape-memory component.

2. An energy harvesting device according to claim 1, wherein said ferromagnetic component comprises a ferromagnetic material having a Curie temperature that is less than a temperature of said heat source.

3. An energy harvesting device according to claim 2, wherein said mechanical assembly comprises a spring structure that is constructed and arranged to cause said ferromagnetic component to be restored to said second condition after said ferromagnetic component heats up to a temperature that is greater than said Curie temperature.

4. An energy harvesting device according to claim 1, wherein a material of said shape-memory component comprises a shape memory alloy having an Austenite phase transformation temperature that is higher than said Curie temperature of said ferromagnetic material such that said shape-memory component causes said mechanical assembly to move said ferromagnetic component through said transient state to said second configuration after being heated to at least said Austenite phase transformation temperature in said first configuration.

5. An electrical device, comprising:
an energy harvester; and
an electrically operable system electrically connected to said energy harvester to receive
electrical energy from said energy harvester,
wherein said energy harvester comprises:
a ferromagnetic component suitable to be arranged between a heat source and a heat sink;
a mechanical assembly structured to support said ferromagnetic component in a first configuration such that said ferromagnetic component is in thermal contact with said heat source and structured to support said ferromagnetic component in a second configuration such that said ferromagnetic component is in thermal contact with said heat sink, said mechanical assembly structured to have a transient state of motion between said first and second configurations,
wherein said mechanical assembly comprises an electromechanical transducer constructed and arranged to produce electrical power while said mechanical assembly is in said transient state of motion between said first and second configurations, and
wherein said mechanical assembly comprises a shape-memory component.

6. An electrical device according to claim 5, further comprising an electrical energy storage unit arrange in at least selective electrical connection with said energy harvester and said electrically operable system, said electrical energy storage unit being suitable to receive and store electrical energy from said energy harvester and to provide electrical energy to said electrically operable system.

7. An electrical device according to claim 5, wherein said electrically operable system comprises electronic components.

8. An electrical device according to claim 5, wherein said electrically operable system comprises a sensor.

9. An electrical device according to claim 7, wherein said electrically operable system comprises a communications unit.

10. An electrical device according to claim 6, wherein said electrical energy storage unit comprises a battery.

11. An electrical device according to claim 6, wherein said electrical energy storage unit comprises a capacitor.

12. A method of harvesting energy, comprising:
arranging an energy harvester having a ferromagnetic component between a heat source and a heat sink; and
receiving electrical energy output from said energy harvester,
wherein said ferromagnetic component is connected to a mechanical assembly having a first configuration such that said ferromagnetic component is in thermal contact with said heat source, a second configuration such that said ferromagnetic component is in thermal contact with said heat sink, and a transient state of motion between said first and second configurations,
wherein said mechanical assembly comprises an electromechanical transducer constructed and arranged to produce electrical power while said mechanical assembly is in said transient state of motion between said first and second configurations, and
wherein said mechanical assembly comprises a shape-memory component.

* * * * *